United States Patent
Ye et al.

(10) Patent No.: US 9,584,121 B2
(45) Date of Patent: Feb. 28, 2017

(54) COMPACT DESIGN OF SCAN LATCH

(71) Applicant: QUALCOMM Incorporated, San Diego, CA (US)

(72) Inventors: Qi Ye, San Diego, CA (US); Zhengyu Duan, San Diego, CA (US); Steven James Dillen, San Diego, CA (US); Animesh Datta, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/736,213

(22) Filed: Jun. 10, 2015

(65) Prior Publication Data

US 2016/0365856 A1    Dec. 15, 2016

(51) Int. Cl.
*H03K 3/289*    (2006.01)
*H03K 19/00*    (2006.01)
*H03K 3/3562*   (2006.01)

(52) U.S. Cl.
CPC ..... *H03K 19/0013* (2013.01); *H03K 3/35625* (2013.01)

(58) Field of Classification Search
CPC ...... H01L 2924/00; H02M 2001/0025; H02M 3/1588
See application file for complete search history.

(56) References Cited

U.S. PATENT DOCUMENTS

| | | | |
|---|---|---|---|
| 3,887,822 A | 6/1975 | Suzuki | |
| 4,677,318 A | 6/1987 | Veenstra | |
| 6,191,606 B1 * | 2/2001 | Ye | H03K 19/0016 326/102 |
| 6,459,331 B1 * | 10/2002 | Takeuchi | H03K 19/00361 327/311 |
| 6,791,387 B1 * | 9/2004 | Chang | H03K 3/037 327/215 |
| 7,372,305 B1 | 5/2008 | Ngo et al. | |
| 7,400,555 B2 | 7/2008 | Franch et al. | |
| 7,457,998 B1 | 11/2008 | Bhatia et al. | |
| 7,872,492 B2 | 1/2011 | Pitkethly et al. | |
| 7,977,976 B1 | 7/2011 | Tang et al. | |
| 2002/0047739 A1 * | 4/2002 | Mace | G06F 1/10 327/291 |
| 2013/0265092 A1 | 10/2013 | Lee et al. | |
| 2014/0047284 A1 * | 2/2014 | Masleid | G11C 29/32 714/718 |

OTHER PUBLICATIONS

International Search Report and Written Opinion—PCT/US2016/025163—ISA/EPO—Jul. 5, 2016.

* cited by examiner

*Primary Examiner* — Sibin Chen
(74) *Attorney, Agent, or Firm* — Arent Fox LLP

(57) ABSTRACT

A MOS device includes a first latch configured with one latch feedback F and configured to receive a latch input I and a latch clock C. The first latch is configured to output Q, where the output Q is a function of CF, IF, and $\overline{IC}$, and the latch feedback F is a function of the output Q. The first latch may include a first set of transistors stacked in series in which the first set of transistors includes at least five transistors. The MOS device may further include a second latch coupled to the first latch. The second latch may be configured as a latch in a scan mode and as a pulse latch in a functional mode. The first latch may operate as a master latch and the second latch may operate as a slave latch during the scan mode.

24 Claims, 8 Drawing Sheets

| C | I | Q |
|---|---|---|
| 0 | 0 | 1 |
| 0 | 1 | 0 |
| 1 | 0 | store |
| 1 | 1 | store |

| C | I | Q |
|---|---|---|
| 0 | 0 | 1 |
| 0 | 1 | 0 |
| 1 | 0 | store |
| 1 | 1 | store |

COMPACT DESIGN OF SCAN LATCH

BACKGROUND

Field

The present disclosure relates generally to a scan latch design, and more particularly, to a compact design of a scan latch.

Background

A scan latch may be used with a functional latch in a master/slave configuration in a scan chain during a scan mode, where during testing in relation to automatic test pattern generation (ATPG) (during the scan mode), the scan latch is the master and the functional latch is the slave. The functional latch may have an insufficient hold-margin for the scan latch. There is currently a need for a scan latch that avoids issues in relation to an insufficient hold-margin of a functional latch when the scan latch and the functional latch are used in a master/slave configuration during a scan mode. In addition, there is currently a need for a more area-efficient scan latch.

SUMMARY

In an aspect of the disclosure, a metal oxide semiconductor (MOS) device includes a first latch configured with one latch feedback F and configured to receive a latch input I and a latch clock C. The first latch is configured to output Q, where the output Q is a function of CF, IF, and $\overline{IC}$, and the latch feedback F is a function of the output Q. The latch feedback F may be functionally $\overline{Q}$. The output Q may be functionally $\overline{(C+I)F+\overline{IC}}$. The first latch may include a first set of transistors stacked in series. The first set of transistors may include at least five transistors.

In an aspect of the disclosure, a MOS device, including a first latch, receives a latch input I and a latch clock C at the first latch. In addition, the MOS device outputs, at the first latch, an output Q and one latch feedback F to the first latch based on the output Q. The latch feedback F is a function of the output Q. The output Q is a function of CF, IF, and $\overline{IC}$. The latch feedback F may be functionally $\overline{Q}$. The output Q may be functionally $\overline{(C+I)F+\overline{IC}}$.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
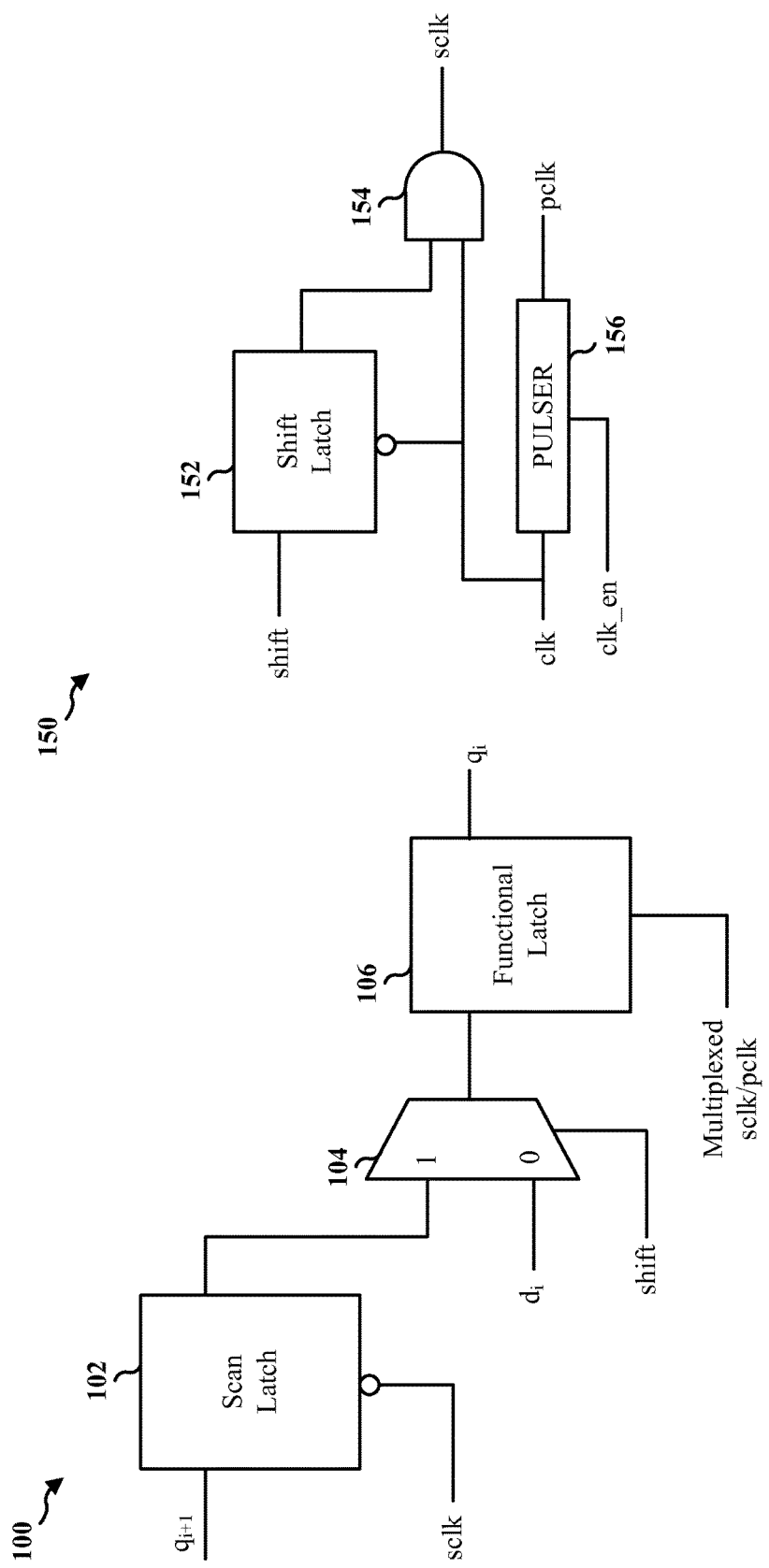
FIG. 1 is a diagram illustrating a first configuration of a scan latch and a functional latch in a master/slave configuration.

FIG. 1 is a diagram illustrating a first configuration 100 of a scan latch 102 and a functional latch 106 in a master/slave configuration. The scan latch 102 is clocked by scan clock sclk and receives input $q_{i+i}$. The output of the scan latch 102 is coupled to input (1) of a multiplexer 104. During a scan mode (test mode), the output of the scan latch 102 is selected at the shift input of the multiplexer 104. During a functional mode (operational mode), the input $d_i$ at input (0) of the multiplexer 104 is selected at the shift input. Accordingly, during a scan mode, the scan latch 102 is operational, and during a functional mode, the scan latch 102 is inoperational. An output of the multiplexer is coupled to the functional latch 106. The functional latch 106 has output $q_i$. A scan clock sclk and a pulse clock pclk are multiplexed to the functional latch 106. The functional latch 106 is clocked by the scan clock sclk during a scan mode, and by the pulse clock pclk during a functional mode. The functional latch 106 implements flip-flop functionality. The functional latch 106 operates as a regular latch (flip-flop) during a scan mode, and as a pulse latch during a functional mode. The scan clock sclk/pulse clock pclk are generated in the diagram 150. The scan clock sclk is generated through a shift latch 152 and an AND gate 154 based on a clock clk input and a shift input. The pulse clock pclk is generated through a pulser (pulse generator) 156 based on the clock clk input and a clock enable clk_en input.

The scan latch 102 may be used with the functional latch 106 in a master/slave configuration in a scan chain, where during testing in relation to ATPG, the scan latch 102 is the master and the functional latch 106 is the slave. The functional latch 106 may operate as a latch during a scan mode and as a pulse latch during a functional mode. The master/slave latches may be referred to as a scanable pulse latch with a parasitic scan latch or as a pulse latch with a shadow latch in a scan path. A pulse latch may provide substantial advantages in performance and power savings over regular flip-flops. A pulse window generated by the pulse generator should be wide enough to provide a good write-margin for reliably writing into the latch. However, if the pulse window is too wide, the latch will need to have a large hold time. A large hold time of the latch requires additional hold logic within the latch, resulting in a latch that requires more area and consumes more power. Pulse latches should also have a sufficient hold-margin. The hold-margin is the minimum hold time of the pulse latch minus the requisite hold time (due to the width of the pulse window) of the pulse latch. If the hold-margin is insufficient, hold violations may occur in the pulse latch.

Figure 5:
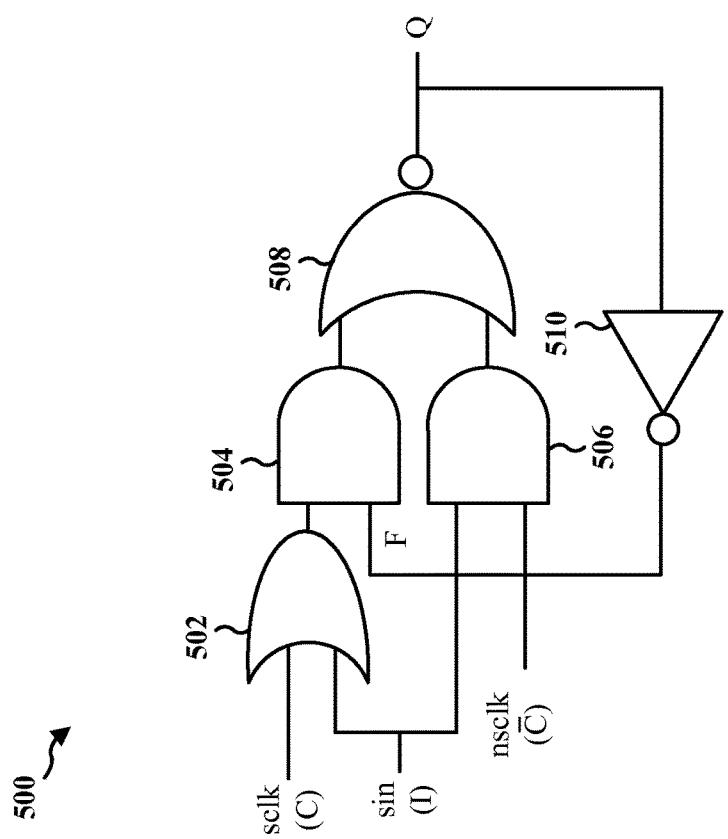
FIG. 5 is a diagram illustrating an exemplary configuration for the scan latch.

In some configurations, the functional latch 106 may have an insufficient hold-margin. For example, buffers may be located before the input (1) of the multiplexer 104 in order to slow down the signal to the function latch 106. However, due to process and manufacturing variations in association with the buffers, hold-margin issues are not guaranteed to be avoided within the functional latch 106. When the scan latch 102 (instead of buffers) is utilized with the functional latch 106 in a master/slave configuration during a scan mode, the functional latch 106 may have an insufficient hold-margin for the scan latch 102. Slowing down the scan latch 102 may address the insufficient hold-margin issue within the functional latch 106. In one configuration, the scan latch 102 may be implemented as shown in FIG. 5 in order to slow down the scan latch 102 and avoid hold-margin issues associated with the functional latch 106. An added benefit of the scan latch configuration of FIG. 5 is that such scan latch has an area-efficient layout (discussed infra in relation to FIG. 7).

Figure 2:
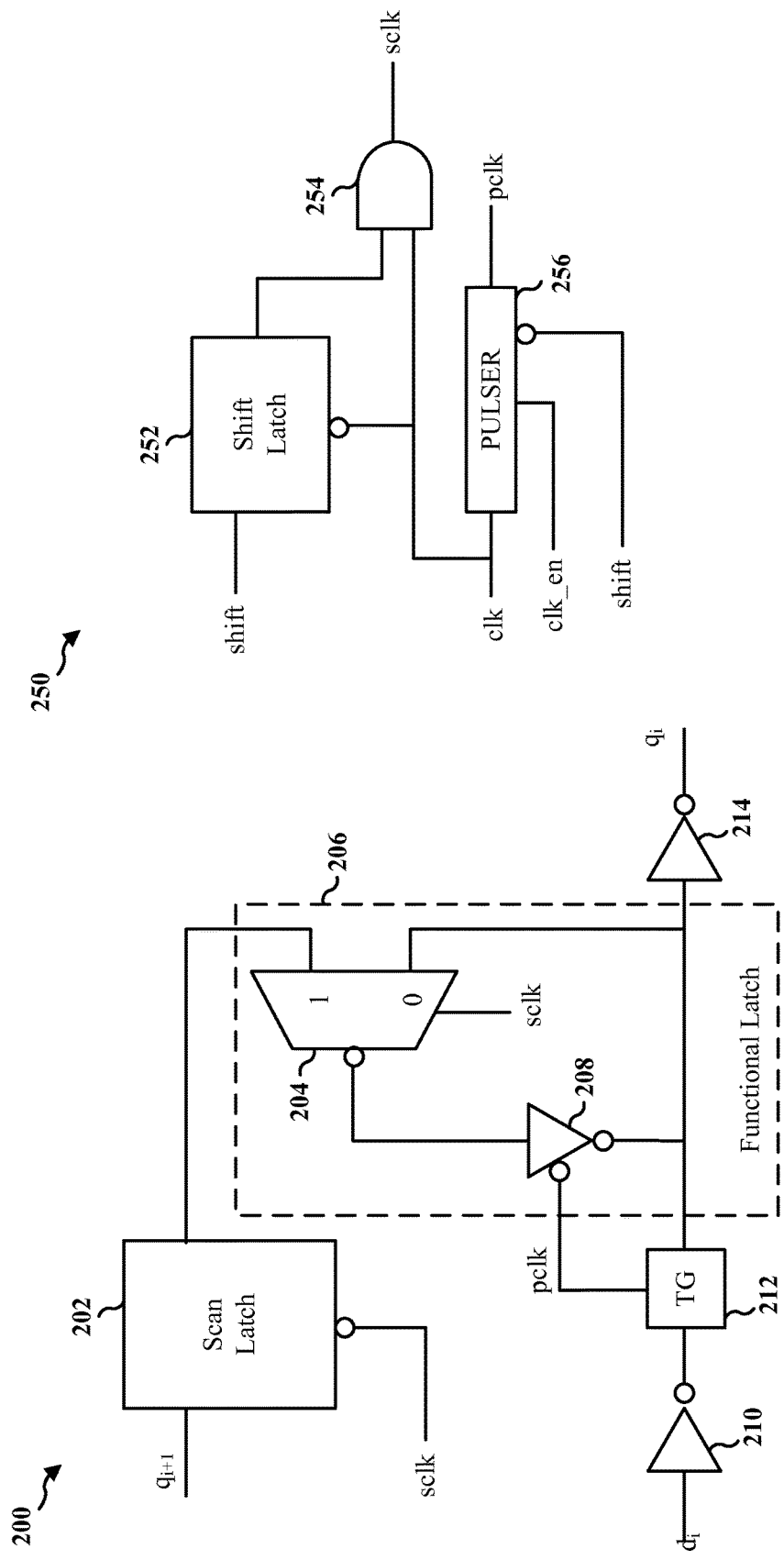
FIG. 2 is a diagram illustrating a second configuration of a scan latch and a functional latch in a master/slave configuration.

FIG. 2 is a diagram illustrating a second configuration 200 of a scan latch 202 and a functional latch 206 in a master/slave configuration. The second configuration 200 is an alternative configuration to the first configuration 100. The scan latch 202 is clocked by scan clock sclk and receives input $q_{i+j}$. The output of the scan latch 202 is coupled to input (1) of a multiplexer 204. An output of the multiplexer 204 is coupled to a tri-state inverter 208 with an active low control. The control for the tri-state inverter 208 is coupled to a pulse clock pclk. The tri-state inverter 208 operates as an inverter when the pulse clock pclk is low, and is in a high impedance state (i.e., turned off) when the pulse clock pclk is high. A data input $d_i$ is coupled to an input of an inverter 210. An output of the inverter 210 is coupled to a transmission gate 212. The transmission gate 212 is controlled by the pulse clock pclk. An output of the transmission gate 212 and an output of the tri-state inverter 208 are coupled together and to an input (0) of the multiplexer 204. The output of the transmission gate 212 and the output of the tri-state inverter 208 are also coupled to an input of an inverter 214. An output of the inverter 214 is $q_i$. The multiplexer 204 and the tri-state inverter 208 operate as the functional latch 206.

During a functional mode (operational mode), the scan clock sclk is held low, selecting input (0) of the multiplexer. In the functional mode, the functional latch 206 operates as a pulse latch based on the pulse clock pclk. During a scan mode (test mode), the pclk is held low, and the scan clk alternately selects input (1) and input (0) of the multiplexer 204. The tri-state inverter 208 is maintained on by holding pclk low, and the transmission gate 212 is off. The scan clock sclk/pulse clock pclk are generated in the diagram 250. The scan clock sclk is generated through a shift latch 252 and an AND gate 254 based on a clock clk input and a shift input. The pulse clock pclk is generated through a pulser (pulse generator) 256 based on the clock clk input, a clock enable clk_en input, and the shift input.

The functional latch 206 of FIG. 2 may also have hold-margin issues in relation to the scan latch 202 during a scan mode, as discussed supra in relation to FIG. 1. In one configuration, the scan latch 202 may be implemented as shown in FIG. 5 in order to slow down the scan latch 202 and avoid hold-margin issues associated with the functional latch 206. As discussed supra and discussed further infra, an added benefit of the scan latch configuration of FIG. 5 is that such scan latch has an area-efficient layout (discussed infra in relation to FIG. 7).

Figure 3:
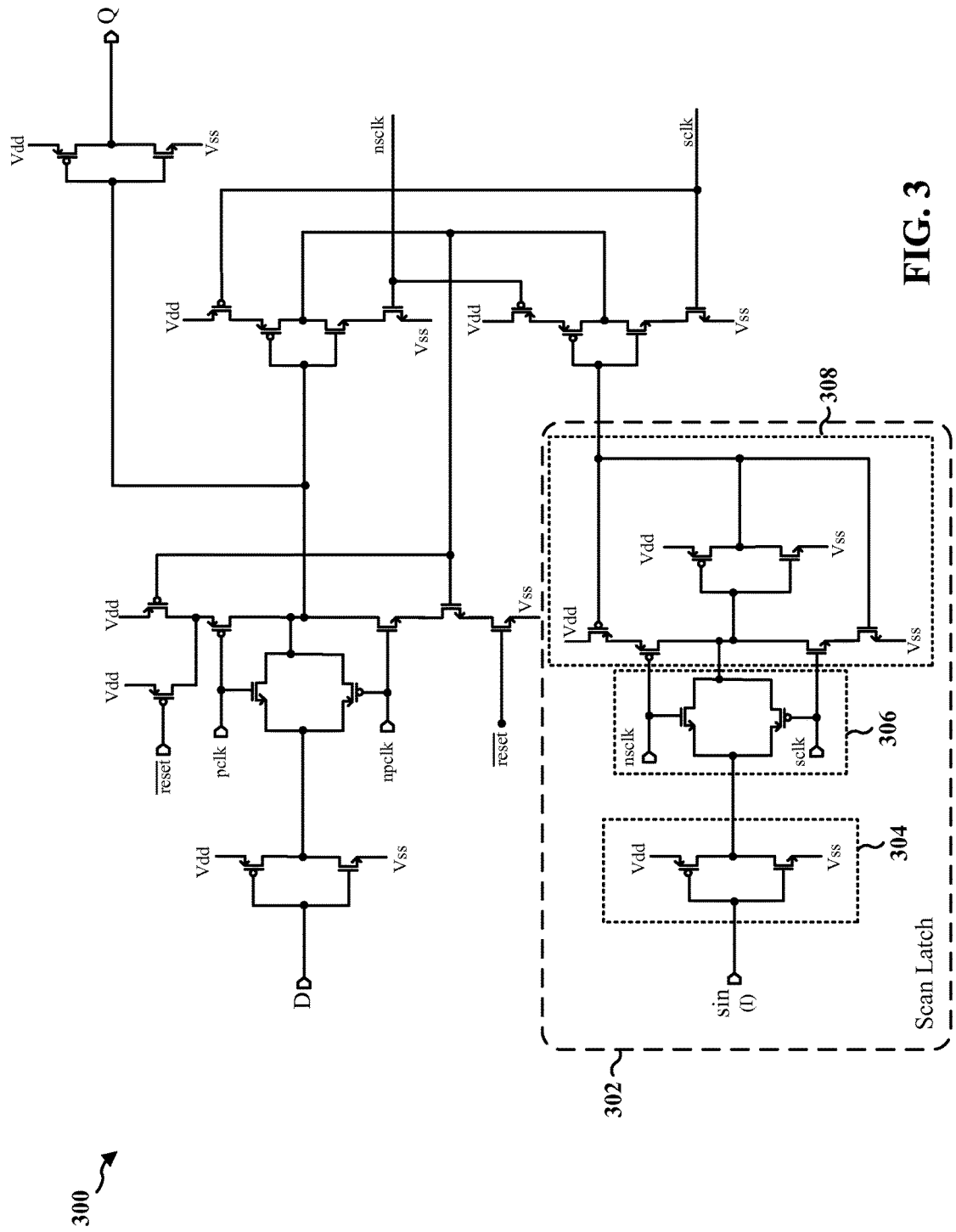
FIG. 3 is a circuit diagram illustrating a first exemplary circuit configuration for the master/slave latch configuration of FIG. 2.

FIG. 3 is a circuit diagram 300 illustrating a first exemplary circuit configuration for the master/slave latch configuration of FIG. 2. The scan latch is indicated by 302. The scan latch 302 corresponds to the scan latch 202. The scan latch 302 includes an inverter 304, a transmission gate 306, and a keeper stage 308. Remaining portions of the circuit diagram 300 are the functional latch 206, the transmission gate 212, and the inverters 210 and 214. In FIG. 3, nsclk is the inverted sclk, and npclk is the inverted pclk.

Figure 4:
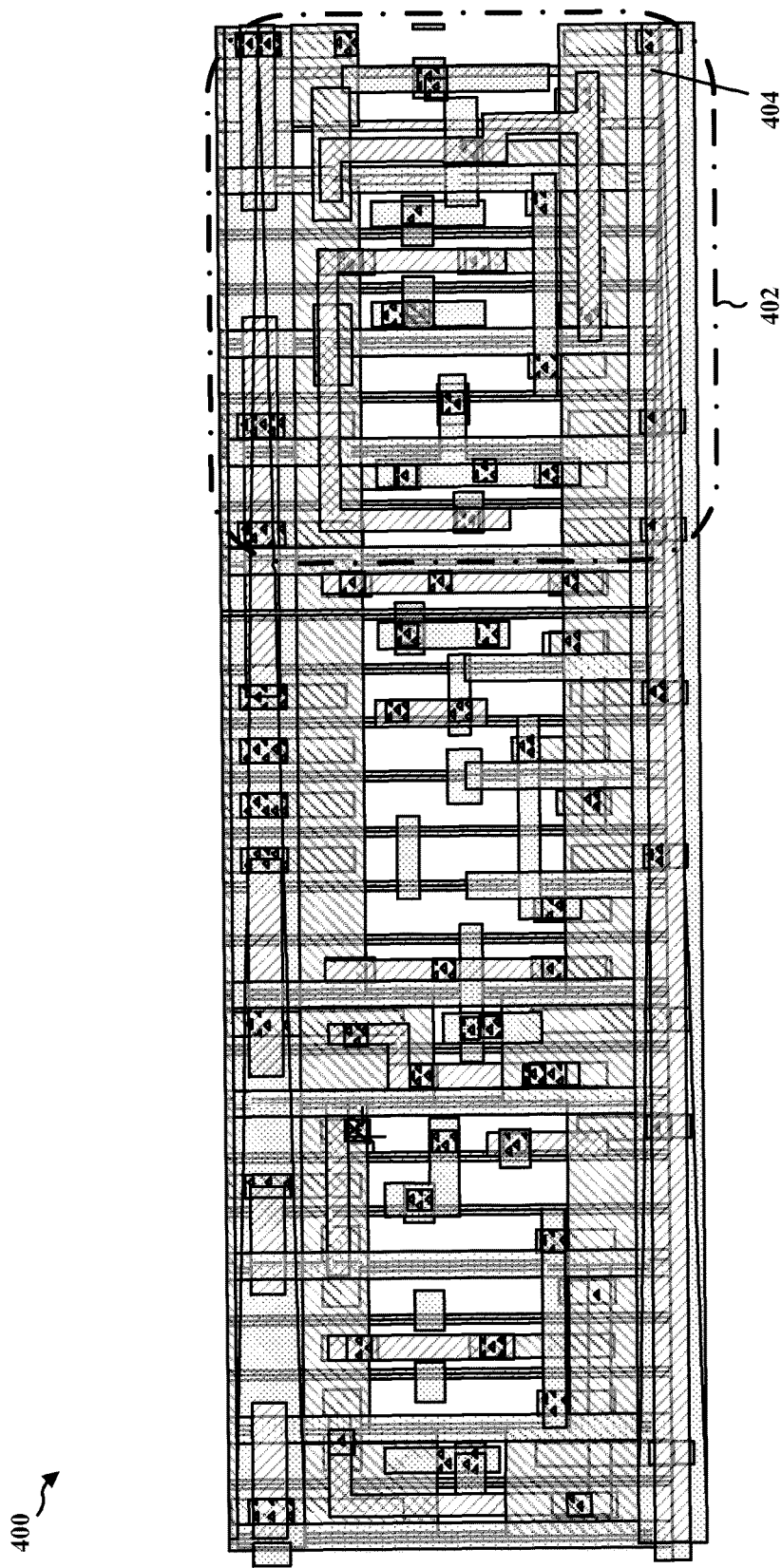
FIG. 4 is a layout diagram illustrating an exemplary layout for the circuit configuration of FIG. 3.

FIG. 4 is a layout diagram illustrating an exemplary layout for the circuit configuration of FIG. 3. The scan latch is indicated by 402. The scan latch 402 corresponds to the scan latch 202/302. The scan latch 402 includes 10 scan devices (transistors) and extends 10 grids. The scan latch 402 with multiplexing devices includes 14 scan devices and extends 13 grids. The entire layout corresponding to the circuit diagram 300 has a width of 28 grids. Note that a layout with x grids includes x gate interconnects (e.g., 404 and other equally spaced gate interconnects) extending across the cell with the same pitch. Specifically, assuming right and left boundaries of a cell are in the middle of a gate interconnect, a cell (e.g., standard cell) with a width of x grids may include x−1 gate interconnects within the cell and two half-width gate interconnects at left/right edges of the cell extending across the cell with the same pitch.

FIG. 5 is a diagram illustrating an exemplary configuration for the scan latch 500. As shown in FIG. 5, the scan latch 500 includes an OR gate 502, an AND gate 504, an AND gate 506, a NOR gate 508, and an inverter 510. The OR gate 502 has a first input coupled to a scan clock sclk (C) and a second input coupled to a scan input sin (I). An output of the OR gate 502 is coupled to a first input of the AND gate 504. The AND gate 506 has a first input coupled to the scan input sin (I) and a second input coupled to an inverse scan clock sclk ($\overline{C}$). An output of the AND gate 504 is coupled to a first input of the NOR gate 508, and an output of the AND gate 506 is coupled to a second input of the NOR gate 508. An output of the NOR gate 508 is labeled Q. The output Q of the NOR gate 508 is input to the inverter 510. An output of the inverter 510, labeled as a latch feedback F, is coupled to a second input of the AND gate 504. Alternatively, the inverter 510 may be replaced by a NAND gate with a shift input set to high during operation of the scan latch 500 (see the NAND gate 624 of FIG. 6, infra). The latch feedback F is functionally $\overline{Q}$, where Q is functionally $\overline{(C+I)F+I\overline{C}}$. The symbol "+" is an OR operation, and is the same as $\vee$ ; the AND operation is the same as $\wedge$. As such, Q is functionally $\overline{((C\vee I)\wedge F)\vee(I\wedge \overline{C})}$..

Other configurations are possible consistent with F being functionally $\overline{Q}$ and Q being functionally $\overline{(C+I)F+I\overline{C}}$. For example, the OR gate 502 and the AND gate 504 may be replaced by a first AND gate with inputs C and F, a second AND gate with inputs I and F, and an OR gate with inputs from the outputs of the first AND gate and the second AND gate. As such, logically, (C+I)F is the same as CF+IF. Further, generally, AB is logically the same as $\overline{\overline{A}+\overline{B}}$, and A+B is the same as $\overline{\overline{A}\overline{B}}$. As such, the AND gate 506 with logical operation $I\overline{C}$ may be replaced with an inverter with input I, and a NOR gate receiving as inputs the output of the inverter ($\overline{I}$) and the scan clock sclk (C).

The truth table for the scan latch 500 is shown in FIG. 5. When the scan clock sclk C is low, the output Q is high when the scan input sin I is low, and the output Q is low when the scan input sin I is high. When the scan clock sclk C is high, the value at Q is stored (no change of state). The scan latch 500 may be considered a set-reset (SR) latch, where set occurs when the scan clock sclk C is low and the scan input sin I is low, and reset occurs when the scan clock sclk C is low and the scan input sin I is high.

The scan latch 500 is slower than a typical latch/flip-flop, and avoids issues in relation to an insufficient hold-margin within a corresponding functional latch. Specifically, when the scan latch 102 is the scan latch 500, the functional latch 106 is less likely to encounter hold-margin issues during a scan mode. Further, when the scan latch 202 is the scan latch 500, the functional latch 206 is less likely to encounter hold-margin issues during a scan mode. The scan latch 500 also has a more compact layout than typical scan latches, as discussed infra in relation to FIG. 7.

Figure 6:
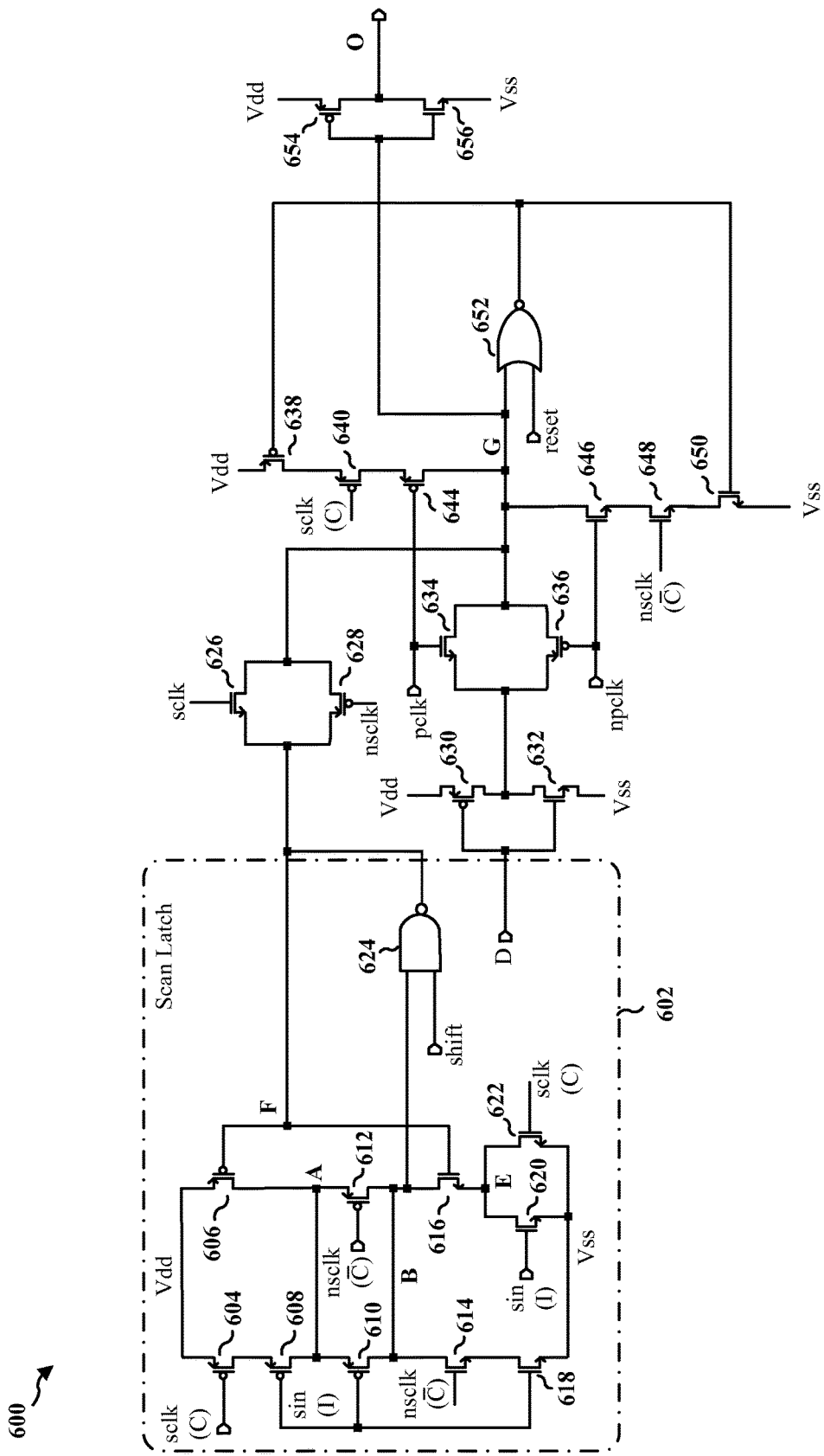
FIG. 6 is a circuit diagram illustrating a second exemplary circuit configuration for the master/slave latch configuration of FIG. 2.

FIG. 6 is a circuit diagram illustrating a second exemplary circuit configuration for the master/slave latch configuration of FIG. 2. The scan latch 500 is indicated as 602. The scan latch 602 includes p-type metal oxide semiconductor (MOS) (pMOS) transistors 604, 606, 608, 610, and 612, and n-type MOS (nMOS) transistors 614, 616, 618, 620, and 622. The pMOS transistor 604 has a source connected to Vdd, a gate connected to a scan clock sclk (C), and a drain coupled to the source of the pMOS transistor 608. The pMOS transistor 608 has a gate connected to a scan input sin (I), and a drain connected to node A. The pMOS transistor 610 is connected in parallel with the pMOS transistor 612, as the source of the pMOS transistor 610 and the source of the pMOS transistor 612 are connected together and to node A, and the drain of the pMOS transistor 610 and the drain of the pMOS transistor 612 are connected together and to node B. The gate of the pMOS transistor 610 is connected to the scan input sin (I). The gate of the pMOS transistor 612 is connected to an inverse scan clock nsclk ($\overline{C}$). The pMOS transistor 606 has a source connected to Vdd, a drain connected to the node A, and a gate connected to node F. The nMOS transistor 614 has a drain connected to node B, a gate connected to the inverse scan clock nsclk ($\overline{C}$), and a source connected to the drain of the nMOS transistor 618. The nMOS transistor 618 has a gate connected to the scan input sin (I), and a source connected to Vss. The nMOS transistor 620 and the nMOS transistor 622 are connected in parallel, with the source of the nMOS transistor 620 connected to the source of the nMOS transistor 622 and to Vss, and with the drain of the nMOS transistor 620 connected to the drain of the nMOS transistor 622 and to node E. The gate of the nMOS transistor 620 is connected to the scan input sin (I). The gate of the nMOS transistor 622 is connected to the scan clock sclk (C). The nMOS transistor 616 has a drain connected to node B, a source connected to node E, and a gate connected to node F. Node F is a feedback path output from the NAND gate 624. When the shift input is high, the NAND gate 624 operates as an inverter. The NAND gate 624 may be replaced by an inverter, as shown in FIG. 5 by the inverter 510. During a functional mode, the shift may be set low. Use of the NAND gate 624 rather than an inverter 510 saves power during the functional mode. Specifically, the NAND gate 624 provides approximately a 4% dynamic power savings (assuming a 15% data activity rate) over use of an inverter 510 during a functional mode.

With respect to remaining portions of the circuit, the nMOS transistor 626 and the pMOS transistor 628 operate as a transmission gate based on the scan clock sclk (C). The transmission gate 626/628 may be turned on when the scan clock sclk (C) is high, and turned off when the scan clock sclk (C) is low. The pMOS transistor 630 and the nMOS transistor 632 operate as an inverter, and are components of the inverter 210 of FIG. 2. The nMOS transistor 634 and the pMOS transistor 636 operate as a transmission gate, and are components of the transmission gate 212 of FIG. 2. The transmission gate 634/636 may be turned on when the pulse clock pclk is high, and turned off when the pulse clock pclk is low. The pulse clock pclk may be held low during a scan mode, and therefore the transmission gate 634/636 may be off during the scan mode. The pMOS transistor 654 and the nMOS transistor 656 operate as an inverter, and are components of the inverter 214 of FIG. 2. The pMOS transistors 638, 640, and 644, the nMOS transistors 646, 648, and 650, and the NOR gate 652 function as the multiplexer 204 and the tri-state inverter 208 of FIG. 2 and are components of the functional latch 206 of FIG. 2. The reset input into the NOR gate 652 is held low during normal operation. When the reset is set to high, the output of the NOR gate 652 is low, and upon both the scan clock sclk (C) and the pulse clock pclk going low, the node G in the functional latch is set to high, and the output O is set to low.

Figure 7:
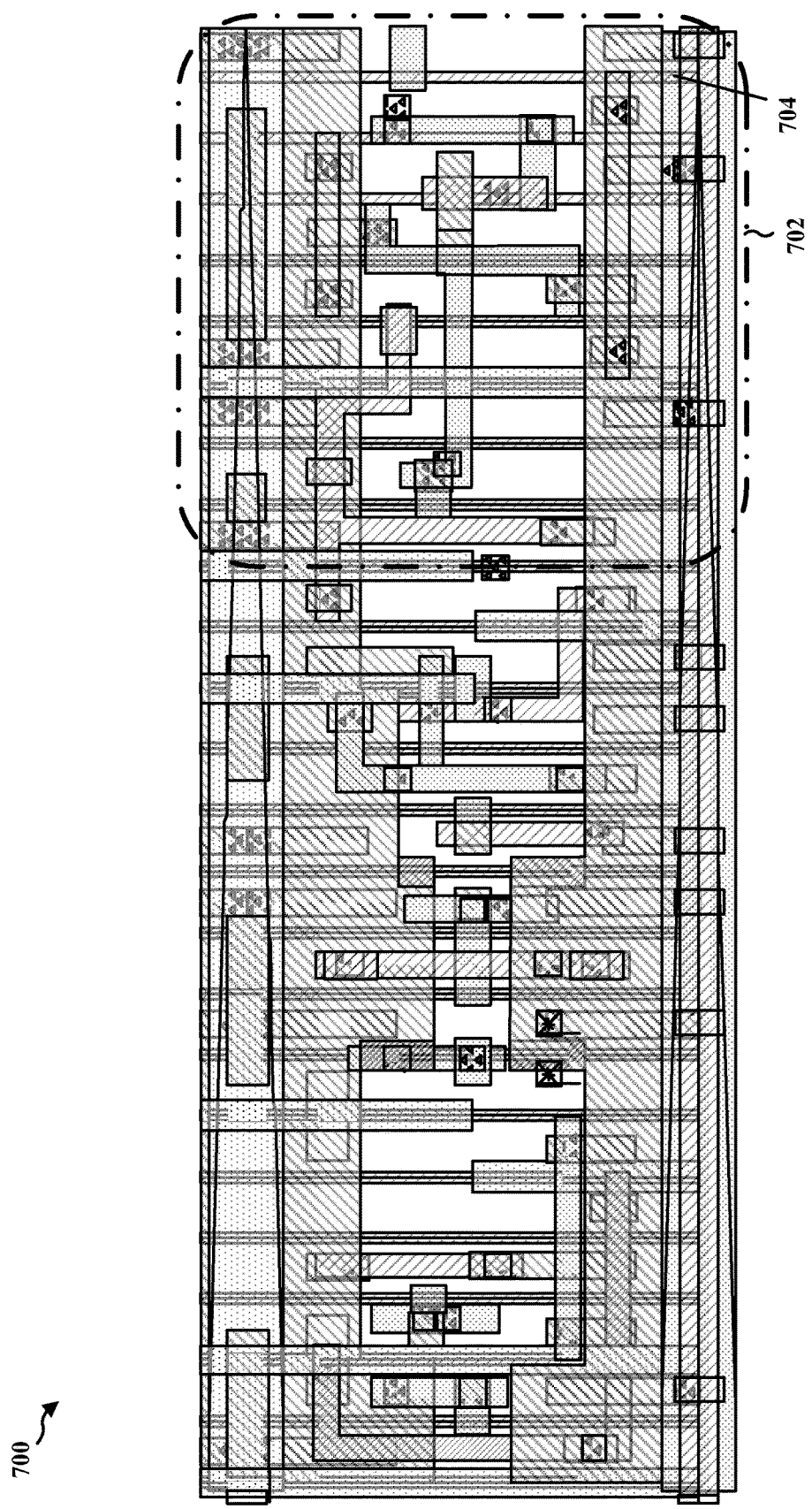
FIG. 7 is a layout diagram illustrating an exemplary layout for the circuit configuration of FIG. 6.

FIG. 7 is a layout diagram illustrating an exemplary layout for the circuit configuration of FIG. 6. The scan latch is indicated by 702. The scan latch 702 corresponds to the scan latch 202/602. The scan latch 702 includes 14 scan devices (transistors) and extends 9 grids. The scan latch 702 with the transmission gate 626/628 includes 16 scan devices. The entire layout corresponding to the circuit diagram 600 has a width of 24 grids. As discussed supra, a layout with x grids includes x gate interconnects (e.g., 704 and other equally spaced gate interconnects) extending across the cell with the same pitch. If the NAND gate 624 is replaced with an inverter (see 510 of FIG. 5), the scan latch 702 would include 12 scan devices and would extend 8 grids, and the entire layout would extend 23 grids. As such, while the scan latch 602 includes more transistors than the scan latch 402, the scan latch 602 has a more compact layout than the scan latch 402. The less compact layout for the scan latch 402 is due to alternating gate connections associated with the transmission gate 306 and the keeper stage 308 in the scan latch 402. The entire layout for the pulse latch including a parasitic scan latch 602 and the NAND gate 624 has approximately a 15% area savings (24 grids/28 grids) over the entire layout for the pulse latch including a parasitic scan latch 402, and provides approximately a 10% leakage current savings due to the 15% area reduction. The entire layout for the pulse latch including a parasitic scan latch 602 and an inverter 510 instead of the NAND gate 624 provides approximately an 18% (23 grids/28 grids) area savings over the entire layout for the pulse latch including a parasitic scan latch 402, but does not provide the approximately 4% dynamic power savings during a functional mode that the scan latch 602 with the NAND gate 624 provides. Accordingly, as discussed supra, the scan latch 602/500 avoids issues in relation to an insufficient hold-margin within a corresponding functional latch by being slower than a typical/traditional latch/flip-flop. Further, the scan latch 602/500 has a reduced area footprint than the scan latch 402/302, and provides leakage current savings due to the area reduction.

Referring again to FIG. 5 and FIG. 6, a MOS device includes a first latch configured with one latch feedback F and configured to receive a latch input I and a latch clock C. The first latch is configured to output Q, where the output Q is a function of CF, IF, and $\overline{IC}$, and the latch feedback F is a function of the output Q. For example, as shown in FIG. 5, the latch feedback F is functionally $\overline{Q}$, and the output Q is functionally $\overline{(C+I)F+I\overline{C}}$. As discussed supra, (C+I)F is the same as CF+IF. As such, the scan latch 500 is a function of CF, IF, and $\overline{IC}$.

In one configuration, the first latch includes a first set of transistors stacked in series, and the first set of transistors includes at least five transistors. For example, as shown in FIG. 6, the first set of transistors includes the pMOS transistors 604, 608, and 610, and includes the nMOS transistors 614 and 618. The pMOS/nMOS transistors 604, 608, 610, 614, and 618 are stacked in series. In one configuration, the first set of transistors includes at least three pMOS transistors (604, 608, 610) and at least two nMOS transistors (614, 618). The stacking of these transistors may provide some layout benefits for reducing the area/footprint of the layout. In one configuration, each transistor of the first set of transistors is coupled to one of the latch input I, the latch clock C, or an inverse latch clock $\overline{C}$. For example, the pMOS transistor 604 is coupled to the scan clock sclk C, the pMOS transistor 608 is coupled to the scan input I, the pMOS transistor 610 is coupled to the scan input I, the nMOS transistor 614 is coupled to the inverse scan clock nsclk $\overline{C}$, and the nMOS transistor 618 is coupled to the scan input I. In one configuration, the first latch further includes a second set of transistors stacked in series. The second set of transistors includes at least three transistors. For example, the pMOS transistor 606, the pMOS transistor 612, and the nMOS transistor 616 are stacked in series. The second set of transistors includes at least two pMOS transistors (606, 612) and at least one nMOS transistor (616). The stacking of these transistors may provide some layout benefits for reducing the area/footprint of the layout. In one configuration, each transistor of the second set of transistors is coupled to one of the latch feedback F, or an inverse latch clock $\overline{C}$. For example, the pMOS transistor 606 is coupled to the latch feedback F, the pMOS transistor 612 is coupled to the inverse scan clock nsclk $\overline{C}$, and the nMOS transistor 616 is coupled to the latch feedback F. In one configuration, the first latch further comprises a third set of transistors in parallel. The third set of transistors is stacked in series with the second set of transistors. For example, the third set of transistors includes the nMOS transistors 620 and 622 connected in parallel. The nMOS transistors 620 and 622 are stacked in series with the second set of transistors 606, 612, 616. The stacking of the second and third sets of transistors may provide some layout benefits for reducing the area/ footprint of the layout. In one configuration, each transistor of the third set of transistors is coupled to one of the latch input I, or the latch clock C. For example, the nMOS transistor 620 is coupled to the scan input sin I, and the nMOS transistor 622 is coupled to the scan clock sclk C.

In one configuration, the first latch includes a first pMOS transistor 610 having a first pMOS transistor source, a first pMOS transistor gate, and a first pMOS transistor drain. The first pMOS transistor gate is coupled to the latch input I. The first latch includes a second pMOS transistor 612 having a second pMOS transistor source, a second pMOS transistor gate, and a second pMOS transistor drain. The second pMOS transistor gate is coupled to an inverse latch clock $\overline{C}$. The second pMOS transistor source is coupled to the first pMOS transistor source at node A. The second pMOS transistor drain is coupled to the first pMOS transistor drain at node B. The first latch includes a first nMOS transistor 614 having a first nMOS transistor source, a first nMOS transistor gate, and a first nMOS transistor drain. The first nMOS transistor drain is coupled to the first pMOS transistor drain and the second pMOS transistor drain at node B. The first latch includes a second nMOS transistor 618 having a second nMOS transistor source, a second nMOS transistor gate, and a second nMOS transistor drain. The second nMOS transistor drain is coupled to the first nMOS transistor source. The second nMOS transistor source is coupled to a first voltage source Vss. The first nMOS transistor gate is coupled to one of the latch input I or the inverse latch clock $\overline{C}$, and the second nMOS transistor gate is coupled to an other one of the latch input I or the inverse latch clock $\overline{C}$. As shown in FIG. 6, the first nMOS transistor gate is coupled to the inverse latch clock $\overline{C}$, and the second nMOS transistor gate is coupled to the latch input I. However, alternatively, the first nMOS transistor gate may be coupled to the latch input I, and the second nMOS transistor gate may be coupled to the inverse latch clock $\overline{C}$.

In one configuration, the first latch further includes a third pMOS transistor 604 having a third pMOS transistor source, a third pMOS transistor gate, and a third pMOS transistor drain. The third pMOS transistor source is coupled to a second voltage source Vdd. The first latch further includes a fourth pMOS transistor 608 having a fourth pMOS transistor source, a fourth pMOS transistor gate, and a fourth pMOS transistor drain. The fourth pMOS transistor source is coupled to the third pMOS transistor drain. The fourth pMOS transistor drain is coupled to the first pMOS transistor source and the second pMOS transistor source at node A. The third pMOS transistor gate is coupled to one of the latch input I or the latch clock C, and the fourth pMOS transistor gate is coupled to an other one of the latch input I or the latch clock C. As shown in FIG. 6, the third pMOS transistor gate is coupled to the latch clock C, and the fourth pMOS transistor gate is coupled to the latch input I. However, alternatively, the third pMOS transistor gate may be coupled to the latch input I, and the fourth pMOS transistor gate may be coupled to the latch clock C.

In one configuration, the first latch further includes a third nMOS transistor 620 having a third nMOS transistor source, a third nMOS transistor gate, and a third nMOS transistor drain. The third nMOS transistor source is coupled to the first voltage source Vss. The third nMOS transistor gate is coupled to the latch input I. The first latch further includes a fourth nMOS transistor 622 having a fourth nMOS transistor source, a fourth nMOS transistor gate, and a fourth nMOS transistor drain. The fourth nMOS transistor source is coupled to the first voltage source Vss. The fourth nMOS transistor drain is coupled to the third nMOS transistor drain at node E. The fourth nMOS transistor gate is coupled to the latch clock C.

In one configuration, the first latch further includes a fifth pMOS transistor 606 having a fifth pMOS transistor source, a fifth pMOS transistor gate, and a fifth pMOS transistor drain. The fifth pMOS transistor source is coupled to the second voltage source Vdd. The fifth pMOS transistor drain is coupled to the first pMOS transistor source and the second pMOS transistor source at node A. The fifth pMOS transistor gate is coupled to the latch feedback F. The first latch further includes a fifth nMOS transistor 616 having a fifth nMOS transistor source, a fifth nMOS transistor gate, and a fifth nMOS transistor drain. The fifth nMOS transistor source is coupled to the third nMOS transistor drain and the fourth nMOS transistor drain at node E. The fifth nMOS transistor drain is coupled to the first pMOS transistor drain and the second pMOS transistor drain at node B. The fifth nMOS transistor gate is coupled to the latch feedback F.

In one configuration, the first latch further includes a NAND gate 624 with a first NAND gate input, a second NAND gate input, and a NAND gate output. The first NAND gate input is coupled to the first pMOS transistor drain, the second pMOS transistor drain, the first nMOS transistor drain, and the fifth nMOS transistor drain at node B. The second NAND gate input is coupled to a shift input. The NAND gate output is the latch feedback F. Alternatively, in one configuration, the first latch further includes an inverter 510 with an inverter input and an inverter output. The inverter input is coupled to the first pMOS transistor drain, the second pMOS transistor drain, the first nMOS transistor drain, and the fifth nMOS transistor drain at node B. The inverter output is the latch feedback F.

In one configuration, the MOS device further includes a second latch (e.g., 106, 206, and the components in FIG. 6 of the functional latch 206). The second latch is configured as a latch in a scan mode and as a pulse latch in a functional mode. The second latch is configured to be clocked with a scan clock sclk in the scan mode and with a pulse clock pclk in the functional mode. The pulse clock pclk is different than the scan clock sclk. In one configuration, the first latch operates as a master latch and the second latch operates as a slave latch during the scan mode. In one configuration, the first latch has a width of at least eight grids including at least eight gate interconnects that extend across the device. For example, the first latch 602 may have a width of nine grids when the latch 602 includes the NAND gate 624, and may have a width of eight grids when the latch 602 includes an inverter (e.g., 510) instead of the NAND gate 624 in the feedback path for F. In one configuration, each of at least five gate interconnects of the at least eight gate interconnects is shared between one pMOS transistor and one nMOS transistor. For example, the pMOS transistor 604 and the nMOS transistor 622 may share the same gate interconnect, and the pMOS transistor 612 and the nMOS transistor 614 may share the same gate interconnect. For another example, the pMOS transistor 608 may share a gate interconnect with one of the nMOS transistor 618 or the nMOS transistor 620, and the pMOS transistor 610 may share a gate interconnect with an other one of the nMOS transistor 618 or the nMOS transistor 620.

Figure 8:
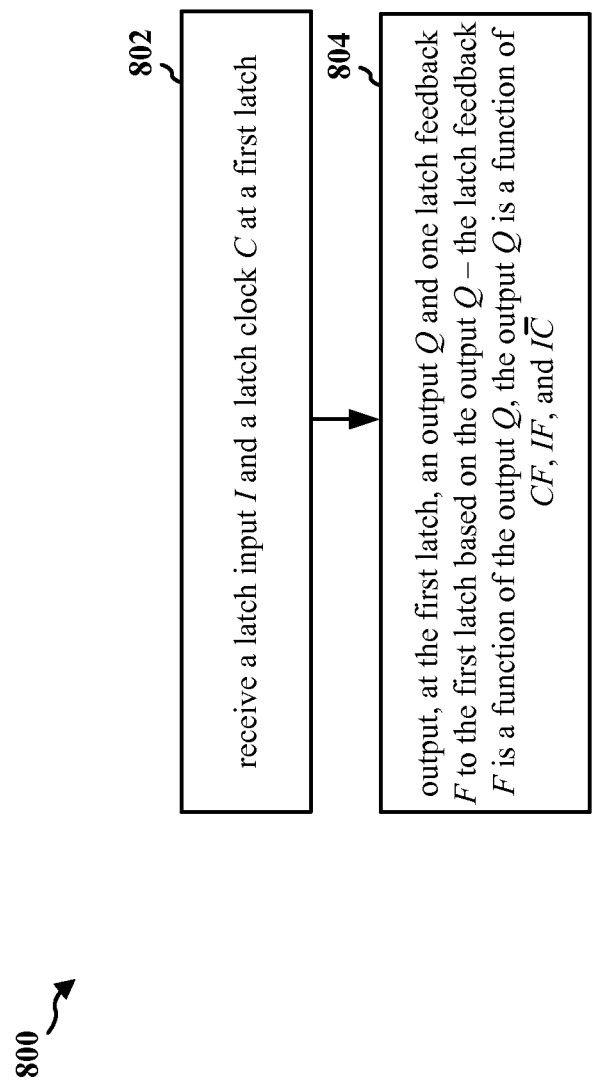
FIG. 8 is a flowchart of an exemplary method of an exemplary MOS device associated with at least one of FIGS. 1, 2, 5, 6, and 7.

FIG. 8 is a flowchart of an exemplary method of an exemplary MOS device associated with at least one of FIGS. 1, 2, 5, 6, and 7. At 802, the MOS device receives a latch input I and a latch clock C at a first latch. At 804, the MOS device, outputs, at the first latch, an output Q and one latch feedback F to the first latch based on the output Q. The latch feedback F is a function of the output Q. The output Q is a function of CF, IF, and $\overline{IC}$. The latch feedback F may be functionally $\overline{Q}$. The output Q may be functionally $\overline{(C+I)F+\overline{IC}}$. As discussed supra in relation to FIG. 6, the first latch may include a first set of transistors 604, 608, 610, 614, 618 stacked in series, where the first set of transistors includes at least five transistors. Referring to FIGS. 1, 2, the output Q may be outputted to a second latch 106/206 coupled to the first latch 102/202. The second latch 106/206 is configured as a latch in a scan mode and as a pulse latch in a functional mode.

In one configuration, a MOS device includes means for receiving a latch input I and a latch clock C at a first latch. In addition, the MOS device includes means for outputting, at the first latch, an output Q and one latch feedback F to the first latch based on the output Q. The latch feedback F is a function of the output Q. The output Q is a function of CF, IF, and $\overline{IC}$. For example, referring to FIG. 5, the OR gate 502 receives a latch input I and a latch clock C. In addition, the NOR gate 508 outputs the output Q and the inverter 510 outputs one latch feedback F to the first latch 500 based on the output Q. In the first latch 500, the latch feedback F is a function of the output Q, and the output Q is a function of CF, IF, and $\overline{IC}$. Specifically, as discussed supra, the latch feedback F is functionally $\overline{Q}$, and the output Q is functionally $\overline{(C+I)F+\overline{IC}}$. As discussed supra, different configurations of the latch 500 are possible consistent with the feedback F being functionally $\overline{Q}$, and the output Q being functionally $\overline{(C+I)F+\overline{IC}}$.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. The term "connected" means "directly connected." The term "coupled" means "connected" or "indirectly connected" through other elements. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) device, comprising:
   a first latch configured with one latch feedback F and configured to receive a latch input I and a latch clock C, the first latch being configured to output Q, where the output Q is a function of CF, IF, and $\overline{IC}$, and the latch feedback F is a function of the output Q;
   wherein the latch feedback F is functionally $\overline{Q}$, and the output Q is functionally $\overline{(C+I)F+\overline{IC}}$.

2. The MOS device of claim 1, wherein the first latch comprises a first set of transistors stacked in series, the first set of transistors comprising at least five transistors.

3. The MOS device of claim 2, wherein the first set of transistors comprises at least three p-type MOS (pMOS) transistors and at least two n-type MOS (nMOS) transistors.

4. The MOS device of claim 2, wherein each transistor of the first set of transistors is coupled to one of the latch input I, the latch clock C, or an inverse latch clock $\overline{C}$.

5. The MOS device of claim 2, wherein the first latch further comprises a second set of transistors stacked in series, the second set of transistors comprising at least three transistors.

6. The MOS device of claim 5, wherein the second set of transistors comprises at least two p-type MOS (pMOS) transistors and at least one n-type MOS (nMOS) transistor.

7. The MOS device of claim 5, wherein each transistor of the second set of transistors is coupled to one of the latch feedback F, or an inverse latch clock $\overline{C}$.

8. The MOS device of claim 5, wherein the first latch further comprises a third set of transistors in parallel, the third set of transistors being stacked in series with the second set of transistors.

9. The MOS device of claim 8, wherein each transistor of the third set of transistors is coupled to one of the latch input I, or the latch clock C.

10. The MOS device of claim 1, further comprising a second latch coupled to the first latch, the second latch being configured as a latch in a scan mode and as a pulse latch in a functional mode.

11. The MOS device of claim 10, wherein the second latch is configured to be clocked with a scan clock in the scan mode and with a pulse clock in the functional mode, the pulse clock being different than the scan clock.

12. The MOS device of claim 10, wherein the first latch operates as a master latch and the second latch operates as a slave latch during the scan mode.

13. The MOS device of claim 1, wherein the first latch has a width of at least eight grids including at least eight gate interconnects that extend across the device.

14. The MOS device of claim 13, wherein each of at least five gate interconnects of the at least eight gate interconnects is shared between one p-type MOS (pMOS) transistor and one n-type MOS (nMOS) transistor.

15. A metal oxide semiconductor (MOS) device, comprising:
 a first latch configured with one latch feedback F and configured to receive a latch input I and a latch clock C, the first latch being configured to output Q, where the output Q is a function of CF, IF, and $\overline{IC}$, and the latch feedback F is a function of the output Q, and wherein the first latch comprises:
 a first p-type MOS (pMOS) transistor having a first pMOS transistor source, a first pMOS transistor gate, and a first pMOS transistor drain, the first pMOS transistor gate being coupled to the latch input I;
 a second pMOS transistor having a second pMOS transistor source, a second pMOS transistor gate, and a second pMOS transistor drain, the second pMOS transistor gate being coupled to an inverse latch clock $\overline{C}$, the second pMOS transistor source being coupled to the first pMOS transistor source, the second pMOS transistor drain being coupled to the first pMOS transistor drain;
 a first n-type MOS (nMOS) transistor having a first nMOS transistor source, a first nMOS transistor gate, and a first nMOS transistor drain, the first nMOS transistor drain being coupled to the first pMOS transistor drain and the second pMOS transistor drain; and
 a second nMOS transistor having a second nMOS transistor source, a second nMOS transistor gate, and a second nMOS transistor drain, the second nMOS transistor drain being coupled to the first nMOS transistor source, the second nMOS transistor source being coupled to a first voltage source,
 wherein the first nMOS transistor gate is coupled to one of the latch input I or the inverse latch clock $\overline{C}$, and the second nMOS transistor gate is coupled to an other one of the latch input I or the inverse latch clock $\overline{C}$.

16. The MOS device of claim 15, wherein the first latch further comprises:
 a third pMOS transistor having a third pMOS transistor source, a third pMOS transistor gate, and a third pMOS transistor drain, the third pMOS transistor source being coupled to a second voltage source; and
 a fourth pMOS transistor having a fourth pMOS transistor source, a fourth pMOS transistor gate, and a fourth pMOS transistor drain, the fourth pMOS transistor source being coupled to the third pMOS transistor drain, the fourth pMOS transistor drain being coupled to the first pMOS transistor source and the second pMOS transistor source,
 wherein the third pMOS transistor gate is coupled to one of the latch input I or the latch clock C, and the fourth pMOS transistor gate is coupled to an other one of the latch input I or the latch clock C.

17. The MOS device of claim 16, wherein the first latch further comprises:
 a third nMOS transistor having a third nMOS transistor source, a third nMOS transistor gate, and a third nMOS transistor drain, the third nMOS transistor source being coupled to the first voltage source, the third nMOS transistor gate being coupled to the latch input I; and
 a fourth nMOS transistor having a fourth nMOS transistor source, a fourth nMOS transistor gate, and a fourth nMOS transistor drain, the fourth nMOS transistor source being coupled to the first voltage source, the fourth nMOS transistor drain being coupled to the third nMOS transistor drain, the fourth nMOS transistor gate being coupled to the latch clock C.

18. The MOS device of claim 17, wherein the first latch further comprises:
 a fifth pMOS transistor having a fifth pMOS transistor source, a fifth pMOS transistor gate, and a fifth pMOS transistor drain, the fifth pMOS transistor source being coupled to the second voltage source, the fifth pMOS transistor drain being coupled to the first pMOS transistor source and the second pMOS transistor source, the fifth pMOS transistor gate being coupled to the latch feedback F; and
 a fifth nMOS transistor having a fifth nMOS transistor source, a fifth nMOS transistor gate, and a fifth nMOS transistor drain, the fifth nMOS transistor source being coupled to the third nMOS transistor drain and the fourth nMOS transistor drain, the fifth nMOS transistor drain being coupled to the first pMOS transistor drain and the second pMOS transistor drain, the fifth nMOS transistor gate being coupled to the latch feedback F.

19. The MOS device of claim 18, wherein the first latch further comprises a NAND gate with a first NAND gate input, a second NAND gate input, and a NAND gate output, wherein:
 the first NAND gate input is coupled to the first pMOS transistor drain, the second pMOS transistor drain, the first nMOS transistor drain, and the fifth nMOS transistor drain;
 the second NAND gate input is coupled to a shift input; and
 the NAND gate output is the latch feedback F.

20. The MOS device of claim 18, wherein the first latch further comprises an inverter with an inverter input and an inverter output, wherein:
 the inverter input is coupled to the first pMOS transistor drain, the second pMOS transistor drain, the first nMOS transistor drain, and the fifth nMOS transistor drain; and
 the inverter output is the latch feedback F.

21. A method of a metal oxide semiconductor (MOS) device, comprising:
   receiving a latch input I and a latch clock C at a first latch; and
   outputting, at the first latch, an output Q and one latch feedback F to the first latch based on the output Q, the latch feedback F being a function of the output Q, the output Q being a function of CF, IF, and $\overline{IC}$;
   wherein the latch feedback F is functionally $\overline{Q}$, and the output Q is functionally $\overline{(C+I)F+IC}$.

22. The method of claim 21, wherein the first latch comprises a first set of transistors stacked in series, the first set of transistors comprising at least five transistors.

23. A metal oxide semiconductor (MOS) device, comprising:
   means for receiving a latch input I and a latch clock C at a first latch; and
   means for outputting, at the first latch, an output Q and one latch feedback F to the first latch based on the output Q, the latch feedback F being a function of the output Q, the output Q being a function of CF, IF, and $\overline{IC}$;
   wherein the latch feedback F is functionally $\overline{Q}$, and the output Q is functionally $\overline{(C+I)F+IC}$.

24. The MOS device of claim 23, wherein the first latch comprises a first set of transistors stacked in series, the first set of transistors comprising at least five transistors.

\* \* \* \* \*